United States Patent
Hughes et al.

(10) Patent No.: US 11,955,575 B2
(45) Date of Patent: Apr. 9, 2024

(54) SOLAR POWER HARVESTING BUILDING ENVELOPE

(71) Applicant: Rensselaer Polytechnic Institute, Troy, NY (US)

(72) Inventors: Michael Hughes, Albany, NY (US); Diana-Andra Borca-Tasciuc, Troy, NY (US); Deborah A. Kaminski, Slingerlands, NY (US)

(73) Assignee: Rensselaer Polytechnic Institute, Troy, NY (US)

( * ) Notice: Subject to any disclaimer, the term of this patent is extended or adjusted under 35 U.S.C. 154(b) by 0 days.

(21) Appl. No.: 17/569,048

(22) Filed: Jan. 5, 2022

(65) Prior Publication Data
US 2022/0302333 A1 Sep. 22, 2022

Related U.S. Application Data

(62) Division of application No. 16/317,642, filed as application No. PCT/US2017/041614 on Jul. 12, 2017, now Pat. No. 11,251,323.

(Continued)

(51) Int. Cl.
*H02S 20/26* (2014.01)
*F21V 8/00* (2006.01)
(Continued)

(52) U.S. Cl.
CPC ............ *H01L 31/0547* (2014.12); *G02B 5/04* (2013.01); *G02B 5/08* (2013.01); *G02B 6/005* (2013.01);
(Continued)

(58) Field of Classification Search
CPC ..... H02S 40/22; H02S 30/10; H01L 31/0543; H01L 31/0547; H01L 31/054; H01L 31/055
See application file for complete search history.

(56) References Cited

U.S. PATENT DOCUMENTS 4,344,417 A * 8/1982 Malecek ................. F24S 23/77
126/704
2007/0227582 A1* 10/2007 Chen ................. G02B 19/0028
136/246

(Continued)

*Primary Examiner* — Bethany L Martin
(74) *Attorney, Agent, or Firm* — Murtha Cullina LLP; Anthony P. Gangemi

(57) ABSTRACT

A system for providing a solar harvesting building envelope is disclosed. The system includes a plurality of solar harvesting apparatus configured to be installed as or on a building envelope in a manner like that of traditional shingles or siding. The apparatus includes a frame having a photovoltaic end wall, and reflective base and side walls. A translucent, wedge-shaped body layer is positioned on the frame. A luminescent species film is positioned at and substantially parallel to a base of the wedge-shaped body layer, such that the luminescent species film is positioned at an angle relative to the photovoltaic end wall. Light incident on the wedge-shaped body layer is concentrated towards the photovoltaic end wall, such as through absorption and re-emission along with scattering by the luminescent species film and internal reflection by the wedge-shaped body layer and the reflective base and side walls of the frame. A plurality of apparatus may be wired together to create the building envelope, which has the added advantage of substantially eliminating shading losses of traditional solar harvesting systems.

16 Claims, 4 Drawing Sheets

Related U.S. Application Data

(60) Provisional application No. 62/361,023, filed on Jul. 12, 2016.

(51) Int. Cl.
    *G02B 5/04*     (2006.01)
    *G02B 5/08*     (2006.01)
    *G02B 6/43*     (2006.01)
    *G02B 19/00*     (2006.01)
    *H01L 31/048*     (2014.01)
    *H01L 31/054*     (2014.01)
    *H01L 31/055*     (2014.01)
    *H02S 30/10*     (2014.01)

(52) U.S. Cl.
    CPC ........... *G02B 6/43* (2013.01); *G02B 19/0019* (2013.01); *G02B 19/0042* (2013.01); *H01L 31/048* (2013.01); *H01L 31/055* (2013.01); *H02S 20/26* (2014.12); *H02S 30/10* (2014.12); *G02B 6/0046* (2013.01); *Y02E 10/52* (2013.01)

(56) References Cited

U.S. PATENT DOCUMENTS

| | | | |
|---|---|---|---|
| 2012/0240979 A1* | 9/2012 | Maeda | H01L 31/055 136/246 |
| 2014/0196785 A1* | 7/2014 | Lin | F24S 23/79 136/259 |
| 2015/0194555 A1* | 7/2015 | Zhang | H01L 31/048 250/487.1 |
| 2016/0002238 A1* | 1/2016 | Umeda | C09B 5/62 546/27 |
| 2016/0329448 A1* | 11/2016 | Chou | H01L 31/0547 |

* cited by examiner

SOLAR POWER HARVESTING BUILDING ENVELOPE

CROSS REFERENCE TO RELATED APPLICATION(S)

This application is a divisional application of and claims priority benefit of co-pending U.S. patent application Ser. No. 16/317,642, filed Jan. 14, 2019, which claims priority benefit of International Patent Application No. PCT/US2017/041614, filed Jul. 12, 2017, which claims priority benefit of U.S. Provisional Patent Application No. 62/361,023, filed Jul. 12, 2016, the contents of which are incorporated by reference as if disclosed herein in their entireties.

BACKGROUND

Photovoltaics (PV) are envisioned to be part of net-zero energy building design. However, this may remain an elusive goal unless economically and environmentally sensible solutions are found to allow for the widespread use of this technology. The modest ratio of performance (efficiency of energy conversion) to system cost remains the main obstacle to the widespread use of PV cells. One way to reduce cost is by using concentrators to collect sunlight from large surface areas and concentrate it onto small areas of PV cells. Some exemplary concentration systems include reflective, refractive, and luminescent concentrators.

Luminescent solar concentrators typically consist of a plastic sheet doped with luminescent materials. The light incident on the concentrator's surface is partially absorbed and re-emitted by the luminescent species at longer wavelengths. The luminescent emission and remaining incident light is concentrated onto an edge where a photovoltaic cell is placed.

Luminescent solar concentrators have key advantages over refractive or reflective concentrators. They accept direct and indirect daylight and thus may eliminate the use of solar tracking systems. Further, they may be spectrally coupled to solar cells by matching the emission peak to the peak in the solar cell's spectral response, which results in enhanced conversion efficiencies (more efficient conversion of light to electricity).

Effectively utilizing phosphors in luminescent solar concentrators is challenging because they are highly light scattering, which may increase both non-emissive absorption and escape cone losses. For this reason, there have been very few investigations into the performance of luminescent solar concentrators utilizing phosphors.

SUMMARY

According to an embodiment of the disclosed subject matter, a solar power generation system including a modular construction building envelope on an exterior of a structure is provided. The solar power generation system includes a plurality of modular construction materials wired together and positioned on the building envelope. The modular construction materials include a frame including an end wall fabricated substantially from a photovoltaic material, a reflective base, and opposing reflective side walls; a wedge-shaped translucent body layer on the frame; a film including luminescent species embedded at a base of the wedge-shaped translucent body layer; and a reflective film positioned between the wedge-shaped translucent body layer and the reflective base. The wedge-shaped translucent body layer has a length, a first end having a height at the photovoltaic material, a second end opposing the first end, and an aspect ratio of the length to the first end height is greater than about 1.

In some embodiments, the wedge-shaped translucent body layer is composed substantially of silicon, vinyl, other translucent plastics, glass, hydrogels, or a combination thereof.

In some embodiments, the film is composed substantially of fluorescent dye, quantum dots, phosphor, or a combination thereof.

In some embodiments, the film has a luminescent species concentration of about 25 mg/ml to about 30 mg/ml.

In some embodiments, the aspect ratio of the length to the first end height is greater than about 4.

In some embodiments, the frame is composed of metal, plastic, foam, wood, ceramic, or a combination thereof.

In some embodiments, the photovoltaic material is composed of polycrystalline silicon, monocrystalline silicon, GaAs, CdTe, CIGS, perovskite, or a combination thereof.

In some embodiments, the modular construction materials includes a gap between the end wall and the wedge-shaped translucent body layer.

In some embodiments, the modular construction materials includes a gap between the wedge-shaped translucent body layer and the reflective film.

According to another embodiment of the disclosed subject matter, a solar power harvesting apparatus is provided. The apparatus includes a frame including an end wall fabricated substantially from a photovoltaic material, a reflective base, and opposing reflective side walls; a reflective film positioned above the reflective base at an angle to the photovoltaic material end wall; a wedge-shaped translucent body layer positioned on the reflective film, the wedge-shaped translucent body layer having a length, a first end having a height at the photovoltaic material end wall, a second end opposing the first end; a film including luminescent species positioned at a base of the wedge-shaped translucent polymeric body, the reflective film and the luminescent species film defining substantially parallel planes; and a first gap between the photovoltaic material end wall and the first end. An aspect ratio of the length to the first end height is greater than about 7.

In some embodiments, the film has a luminescent species concentration of about 25 mg/ml to about 30 mg/ml.

In some embodiments, the apparatus includes a second gap between the translucent body layer and the reflective film.

In some embodiments, the film is composed substantially of fluorescent dye, quantum dots, phosphor, or a combination thereof.

In some embodiments, the frame is composed of metal, plastic, foam, wood, ceramic, or a combination thereof.

In some embodiments, the translucent body layer is composed substantially of silicone, vinyl, other translucent plastics, glass, or a combination thereof.

In some embodiments, the photovoltaic material end wall is composed of polycrystalline silicon, monocrystalline silicon, GaAs, CdTe, CIGS, perovskite, or a combination thereof.

In some embodiments, the film is positioned at a height above the reflective base less than H/2.

In some embodiments, the apparatus is configured to be wired together to a plurality of solar power harvesting apparatus.

Some embodiments of the disclosed subject matter are directed to a solar harvesting apparatus. In some embodiments, the apparatus includes a frame including a base, side walls, and a photovoltaic end wall. In some embodiments, the frame base and side walls are reflective. A wedge-shaped body layer is positioned on and/or in the frame. In some embodiments, the body layer is translucent.

A luminescent species film is positioned at or near the base of the body layer. In some embodiments, the luminescent species film is substantially parallel to the base of the body layer. In some embodiments, the luminescent species film is positioned at an angle to the photovoltaic end wall. Light incident on the body layer is transmitted to the luminescent species film, where it is absorbed and re-emitted and/or scattered. The emitted and scattered light and other refracted light are concentrated towards and eventually absorbed by the photovoltaic end wall.

In some embodiments, a plurality of apparatus are installed as a building envelope, such as in place or, or in addition to, traditional shingles and siding. In some embodiments, the plurality of apparatus are wired together to maximize power output.

BRIEF DESCRIPTION OF THE DRAWINGS

The drawing show embodiments of the disclosed subject matter for the purpose of illustrating the invention. However, it should be understood that the present application is not limited to the precise arrangements and instrumentalities shown in the drawings, wherein.

DETAILED DESCRIPTION

Figure 1A:
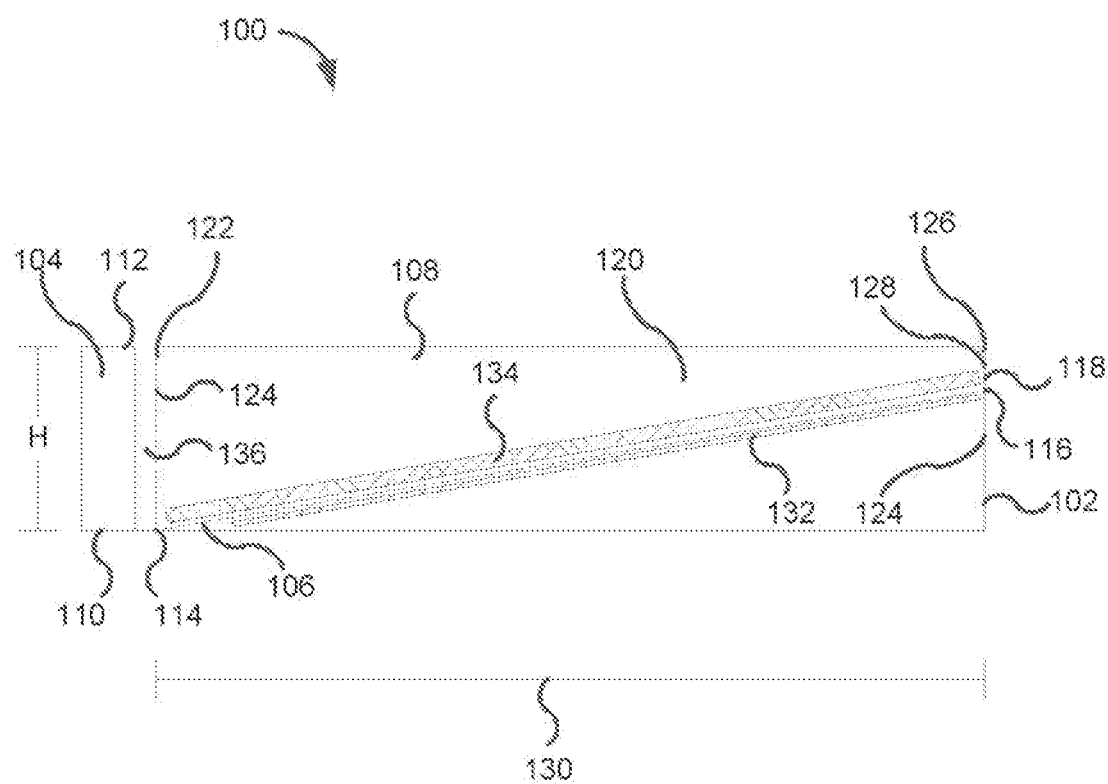
FIG. 1A is a schematic drawing of a solar power harvesting apparatus according to some embodiments of the present disclosure.
Figure 1B:
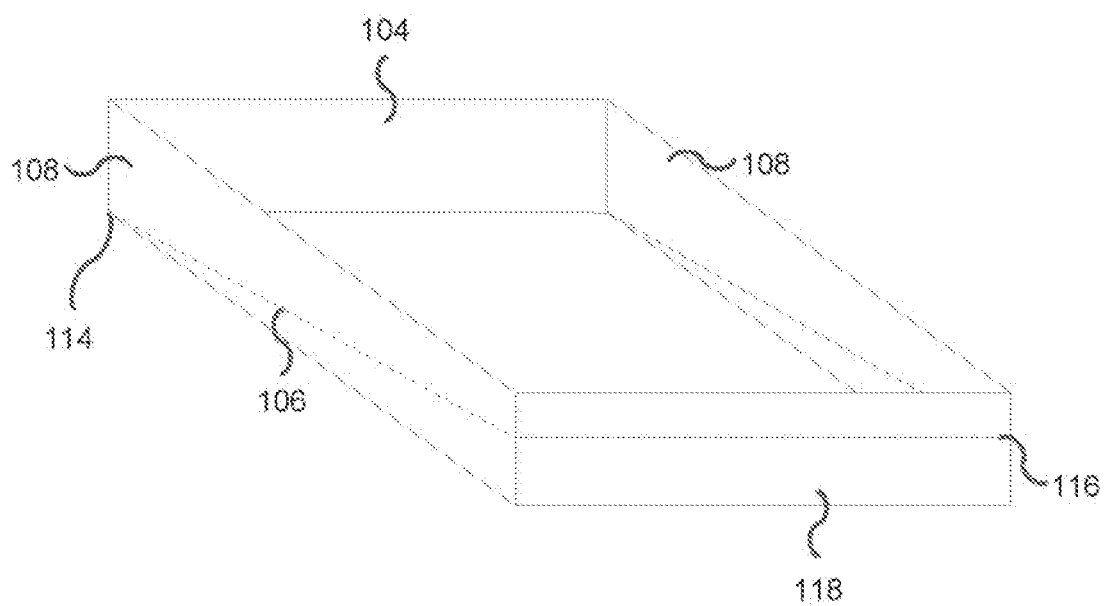
FIG. 1B is a schematic isometric drawing of a solar power harvesting apparatus according to some embodiments of the present disclosure.

Referring now to FIG. 1A, aspects of the disclosed subject matter include a solar power harvesting apparatus 100 including a frame 102. In some embodiments, frame 102 includes an end wall 104, base 106, and a side wall 108. In some embodiments, frame 102 is composed of metal, e.g., aluminum, plastic, e.g., vinyl, foam, wood, ceramic, or a combination thereof. End wall 104 is composed of a photovoltaic material. In some embodiments, end wall 104 is a photovoltaic device. End wall 104 includes a bottom 110 and a top 112 and has a wall height (H) defined between the bottom and the top. In some embodiments, end wall 104 is composed of polycrystalline silicon, monocrystalline silicon, GaAs, CdTe, CIGS, perovskite, or a combination thereof. Base 106 has a first end 114 and a second end 116. In some embodiments, base 106 is positioned at an angle to end wall 104 with first end 114 adjacent bottom 110 of the end wall. In some embodiments, the angle between base 106 and end wall 104 is acute. In some embodiments, the angle between base 106 and end wall 104 is a substantially right angle. In some embodiments, base 106 is reflective. Now referring to FIG. 1B, in some embodiments, frame 102 includes opposing side walls 108. In some embodiments, side wall 108 is reflective. In some embodiments, frame 102 includes an end wall 118 opposing end wall 104. In some embodiments, end wall 118 is reflective.

Referring again to FIG. 1A, apparatus 100 includes a translucent body layer 120. In some embodiments, translucent body layer 120 is positioned on frame 102. In some embodiments, translucent body layer 120 is directly attached to end wall 104. In some embodiments, end wall 104 is attached to translucent body layer 120 but not to frame 102. In some embodiments, translucent body layer 120 is positioned on base 106. In some embodiments, translucent body layer 120 is in contact with side walls 108. In some embodiments, base 106 and/or side walls 108 are reflective where those components contact translucent body layer 120. In some embodiments, translucent body layer 120 is composed of a polymer. In some embodiments, translucent body layer 120 is composed of silicone, vinyl, other translucent plastics, other translucent materials, e.g., glass, hydrogels, etc., or a combination thereof. In some embodiments, translucent body layer 120 is hollow. In some embodiments, translucent body layer 120 includes a first body layer end 122 having a first end height 124 at end wall 104 and a second body layer end 126 having a second end height 128 opposing first body layer end 122. In some embodiments, translucent body layer 120 is wedge-shaped. In some embodiments, second end height 128 is smaller than first end height 124. In some embodiments, translucent body layer 120 has a length 130. In some embodiments, length 130 extends along the entire frame 102. In some embodiments, length 130 extends along less than the entire frame 102. In some embodiments, an aspect ratio of length 130 to first end height 124 is about 1 or greater. In some embodiments, an aspect ratio of length 130 to first end height 124 is greater than about 4. In some embodiments, an aspect ratio of length 130 to first end height 124 is greater than about 7. In some embodiments, a reflective film 132 is positioned between translucent body layer 120 and base 106. In some embodiments, a gap is positioned between translucent body layer 120 and reflective film 132. This gap is created to reduce imperfect reflection from reflective film 132.

Figure 2:
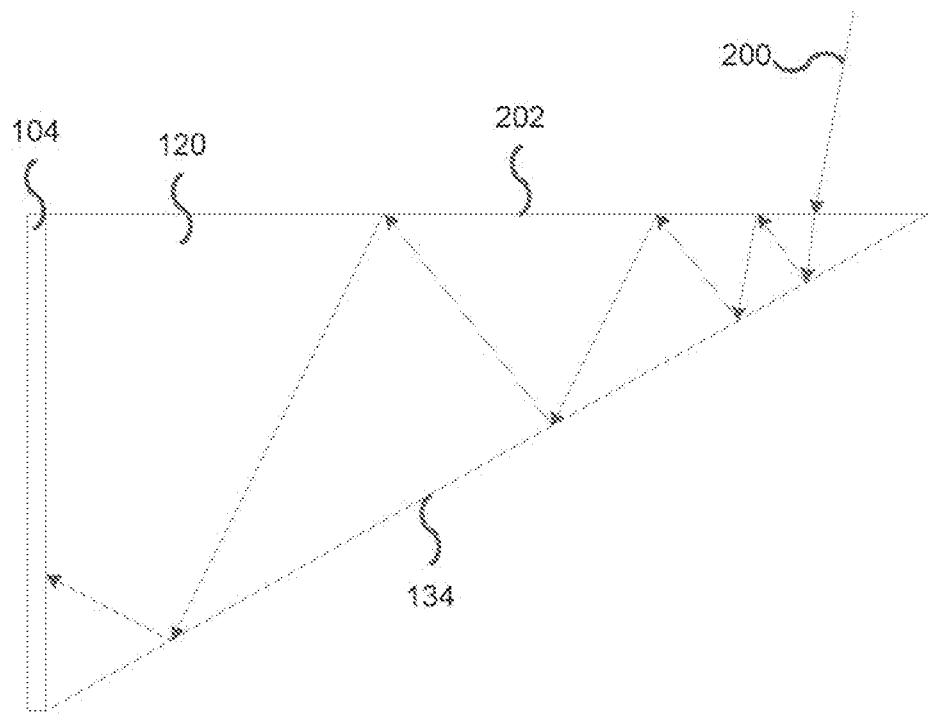
FIG. 2 is a schematic drawing of a solar power harvesting apparatus according to some embodiments of the present disclosure.

In some embodiments, a film 134 is positioned in translucent body layer 120. In some embodiments, film 134 is positioned between translucent body layer 120 and base 106. In some embodiments, film 134 extends along the entire length 130. In some embodiments, film 134 extends along less than the entire length 130. In some embodiments, the film 134 is composed of fluorescent dye, quantum dots, phosphor, or a combination thereof. In some embodiments, film 134 has a luminescent species concentration higher than 0 mg/ml. In some embodiments, film 134 has a luminescent species concentration of about 20 mg/ml to about 40 mg/ml. In some embodiments, film 134 has a concentration of about 25 mg/ml to about 30 mg/ml. In some embodiments, film 134 is positioned at a height above base 106 or reflective film 132 less than H/2. In some embodiments, film 134 is positioned at a height above base 106 or reflective film 132 less than 10 nm. In some embodiments, base 106 and film 134 are substantially parallel, defining substantially parallel planes. In some embodiments, base 106 and film 134 are non-parallel. In some embodiments, a film 134 is positioned at the base of translucent body layer 120. In some embodiments, base 106 is positioned directly underneath film 134. In some embodiments, film 134 is embedded in translucent body layer 120. Referring now to FIG. 2, the functionality of apparatus 100 is pictographically portrayed. Light from a source 200, i.e. direct daylight, diffuse light, artificial lighting, etc., falls on translucent body layer 120. The light is refracted into the translucent body layer 120 when it strikes the body layer surface 202. The light then continues to film 134, where it is absorbed and/or scattered. The absorbed light is then emitted by film 134. At least in part because of the wedge shape of translucent body 120, the emitted light is concentrated in a direction towards that end wall. Light is contained through reflection via the frame 102 and/or base 106, side wall 108, end wall 118, via reflective film 132, internal reflection by body layer surface 202, and/or via repeated absorption/emission and scattering by film 134. This successive reflection may increase total internal reflection, concentrating the light and focusing it towards end wall 104 for absorption and power generation.

Referring again to FIG. 1, in some embodiments, a gap 136 is positioned between end wall 104 and first body layer end 122. Gap 136 close to end wall 104 may be left as is or may be filled with an optical transparent material with index of refraction between that of surface material of end wall 104 and translucent body layer 120, in order to minimize reflections at the end wall 104/translucent body layer 120 interface.

In some embodiments, a plurality of apparatus 100 are positioned on a building envelope, e.g., as a solar power harvesting system for that building. In these embodiments, the plurality of apparatus 100 act as modular construction materials positioned on the building envelope or acting themselves as the building envelope. Films 134 from the plurality of apparatus 100 receive light incident on translucent body layer 120 and help concentrate the incident light towards the plurality of end walls 104 for absorption and power generation. In some embodiments, the plurality of apparatus 100 are wired to maximize the power output. In some embodiments, the plurality of apparatus 100 are wired in parallel. In some embodiments, the plurality of apparatus 100 are wired in series. In some embodiments, the plurality of apparatus 100 are wired in a combination of parallel and series.

Apparatus consistent with the present disclosure offer myriad advantages over previous systems. The concentration of luminescent species as a film, placement of that film at a base of a translucent body layer, and the use of a wedge-shaped body layer increases overall percentage of light absorbed by the photovoltaic material end wall, which results in increased power per unit area in the apparatus. Further, the ability of the apparatus of the present disclosure to internally reflect and concentrate light towards the photovoltaic end wall means less reliance on direct or specific incidence angles for light.

Figure 3:
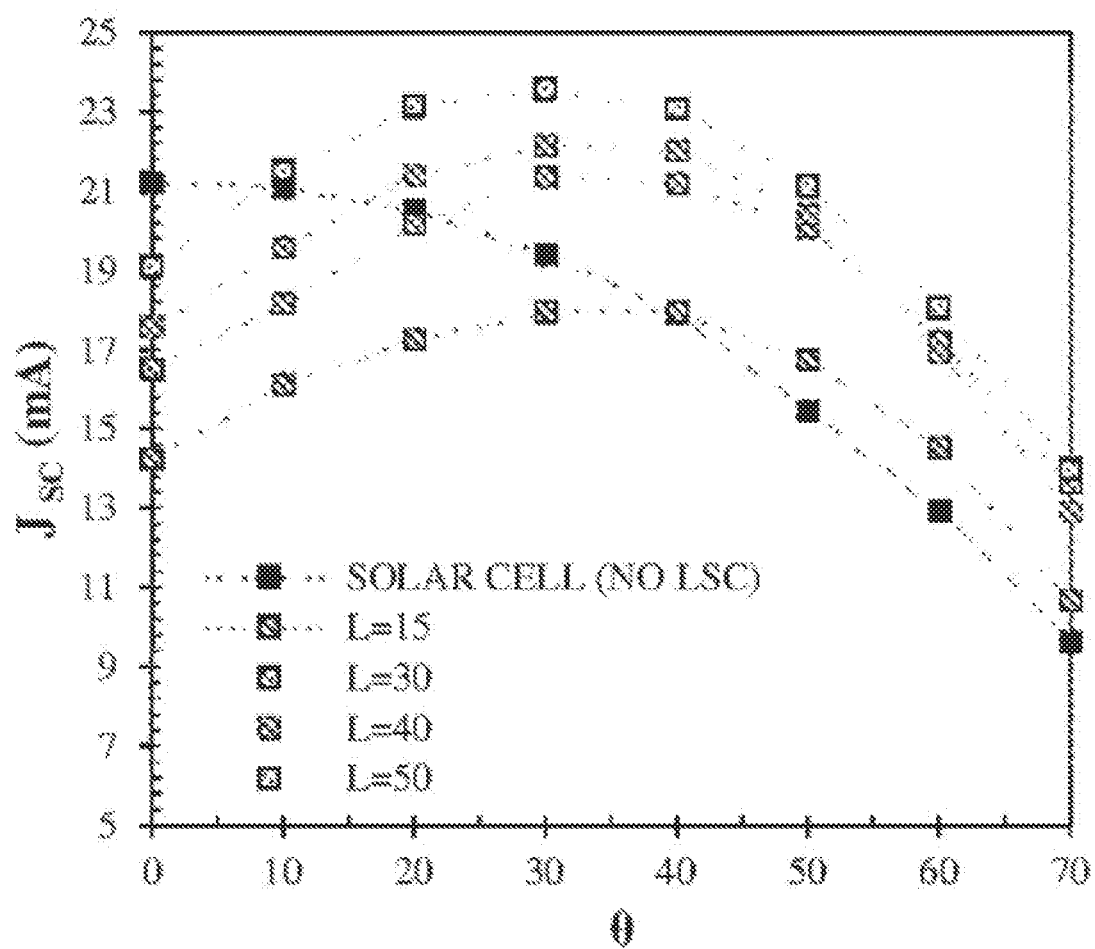
FIG. 3 is a graph showing improved short circuit current of a solar power harvesting apparatus according to some embodiments of the present disclosure compared to a lone solar cell.

Referring now to FIG. 3, this graph gives the short circuit current ($J_{sc}$) as a function of light incidence angel for solar harvesting apparatus according to some embodiments of the present disclosure compared to a solar cell alone. The angle of incidence is measured from the surface normal of the apparatus in the clockwise direction. The solar harvesting apparatus was capable of producing greater $J_{sc}$ for a portion of all incidence angles investigated. This means there is enhancement in the flux of photons absorbed by the photovoltaic end wall of the apparatus at least as a result of the translucent body layer, film, and/or the frame compared to the solar cell without such components. The height is held constant at 7.2 mm and the lengths are given in millimeters.

Thus, the apparatus may be installed in areas where previous designs would have been considered too ineffective or inefficient, making the apparatus advantageous for use in the construction of a solar harvesting envelope for a building. For example, instead of installing shingles, siding, and then installing traditional solar panels over them, the apparatus of the present disclosure enables installation of all three at the same time. The apparatus is also effective for use in walkways, railings, doors, awnings, window shutters, mini-blinds, or any other surface exposed to light. Finally, the modular construction of the apparatus substantially eliminates the impact of shading losses, again making the apparatus highly advantageous for use as a solar harvesting envelope for a building.

Although the disclosed subject matter has been described and illustrated with respect to embodiments thereof, it should be understood by those skilled in the art that features of the disclosed embodiments can be combined, rearranged, etc., to produce additional embodiments within the scope of the invention, and that various other changes, omissions, and additions may be made therein and thereto, without parting from the spirit and scope of the present invention.

What is claimed is:

1. A solar power generation system including a modular construction building envelope on an exterior of a structure comprising:
   a plurality of modular construction materials wired together and positioned on said building envelope, said modular construction materials comprising:
   a frame including an end wall fabricated substantially from a photovoltaic material, a reflective base, and opposing reflective side walls;
   a wedge-shaped translucent body layer on said frame, said wedge-shaped translucent body layer having a hollow interior;
   a first film comprising luminescent species embedded at a base of said wedge-shaped translucent body layer, said first film positioned at a height above said reflective base;
   a second film being reflective positioned between said wedge-shaped translucent body layer and said reflective base, said second reflective film being separate from said reflective base, said second reflective film having a length as measured between a first end and a second end thereof; and
   a gap between said translucent body layer and said second reflective film, said gap having a uniform height as measured along the length of said second reflective film;
   wherein said wedge-shaped translucent body layer has a length, a first end having a height at said photovoltaic material, a second end opposing said first end, and an aspect ratio of said length to said first end height is greater than about 1.

2. The system of claim 1, wherein said wedge-shaped translucent body layer is composed substantially of silicon, vinyl, other translucent plastics, glass, hydrogels, or a combination thereof.

3. The system of claim 1, wherein said first film is composed substantially of fluorescent dye, quantum dots, phosphor, or a combination thereof.

4. The system of claim 3, wherein said first film has a luminescent species concentration of about 25 mg/ml to about 30 mg/ml.

5. The system of claim 1, wherein said aspect ratio of said length to said first end height is greater than about 4.

6. The system of claim 1, wherein said frame is composed of metal, plastic, foam, wood, ceramic, or a combination thereof.

7. The system of claim 1, wherein said photovoltaic material is composed of polycrystalline silicon, monocrystalline silicon, GaAs, CdTe, CIGS, perovskite, or a combination thereof.

8. The system of claim 1, further comprising a second gap between said end wall and said wedge-shaped translucent body layer.

9. A solar power harvesting apparatus comprising:
- a frame including an end wall fabricated substantially from a photovoltaic material, a reflective base, and opposing reflective side walls;
- a first film being reflective positioned above said reflective base at an angle to said photovoltaic material end wall, said first reflective film being separate from said reflective base, said first reflective film having a length as measured between a first end and a second end thereof;
- a wedge-shaped translucent body layer positioned above said first reflective film, said wedge-shaped translucent body layer having a hollow interior, said wedge-shaped translucent body layer having a length, a first end having a height at said photovoltaic material end wall, and a second end opposing said first end;
- a second film comprising luminescent species positioned at a base of said wedge-shaped translucent polymeric body, said second luminescent species film positioned at a height above said reflective base, said first reflective film and said second luminescent species film defining parallel planes;
- a first gap between said translucent body layer and said first reflective film, said first gap having a uniform height as measured along the length of said first reflective film; and
- a second gap between said photovoltaic material end wall and said first end;
- wherein an aspect ratio of said length to said first end height is greater than about 7.

10. The apparatus of claim 9, wherein said second film has a luminescent species concentration of about 25 mg/ml to about 30 mg/ml.

11. The apparatus of claim 9, wherein said second film is composed substantially of fluorescent dye, quantum dots, phosphor, or a combination thereof.

12. The apparatus of claim 9, wherein said frame is composed of metal, plastic, foam, wood, ceramic, or a combination thereof.

13. The apparatus of claim 9, wherein said translucent body layer is composed substantially of silicone, vinyl, other translucent plastics, glass, or a combination thereof.

14. The apparatus of claim 9, wherein said photovoltaic material end wall is composed of polycrystalline silicon, monocrystalline silicon, GaAs, CdTe, CIGS, perovskite, or a combination thereof.

15. The apparatus of claim 9, wherein said second film is positioned at a height above said reflective base less than H/2.

16. The apparatus of claim 9, wherein the apparatus is configured to be wired together to a plurality of solar power harvesting apparatus.

* * * * *